United States Patent

[11] 3,613,088

[72] Inventor Henry T. Brendzel
Parsippany, N.J.

[21] Appl. No. 861,433
[22] Filed Sept. 26, 1969
[45] Patented Oct. 12, 1971

[73] Assignee Bell Telephone Laboratories, Incorporated
Murray Hill, Berkeley Heights, N.J.

[54] RIPPLE-THROUGH COUNTERS HAVING MINIMUM OUTPUT PROPAGATION DELAY TIMES
4 Claims, 3 Drawing Figs.

[52] U.S. Cl. .......... 340/172.5
[51] Int. Cl. .......... G06f 9/06
[50] Field of Search .......... 340/172.5; 235/175, 92

[56] References Cited
UNITED STATES PATENTS

| | | | |
|---|---|---|---|
| 3,198,939 | 8/1965 | Helbig et al. | 235/175 |
| 3,500,024 | 3/1970 | Stacy | 235/92 |
| 3,510,633 | 5/1970 | Kintner | 235/92 |

*Primary Examiner*—Gareth D. Shaw
*Assistant Examiner*—R. F. Chapuran
*Attorneys*—R. J. Guenther and William L. Keefauver

ABSTRACT: A process of constructing ripple-through binary counters having minimum output propagation delay times. The process utilizes the desired values of loop length, clock frequency and single-stage delay time to specify the number of stages in the counter, the terminal state of the counter, and the logic gate configuration required to reset the counter from its terminal state to its initial state. A counter constructed in accordance with this process has a minimum propagation delay before producing an output.

INVENTOR
H. T. BRENDZEL
BY R.O. Nimtz
ATTORNEY

RIPPLE-THROUGH COUNTERS HAVING MINIMUM OUTPUT PROPAGATION DELAY TIMES

GOVERNMENT CONTRACT

The invention herein claimed was made in the course of, or under contract with the Department of the Navy.

BACKGROUND OF THE INVENTION

1. Field of the Invention

This invention relates to the construction of synchronous circuits and, particularly, to the construction of ripple-through counters.

2. Description of the Prior Art

Recent years have seen a vast increase in the manufacture and use of digital circuitry to perform computing and control functions. Most of this digital circuitry operates synchronously, that is, in a particular timed sequence. The timing sequences required by synchronous digital circuits are supplied by one or more timing circuits, known as clocks, that generate control pulses at a predetermined rate. Often, a high frequency oscillator is used as the system clock and counting circuits, triggered by the system clock, are used to supply lower frequency timing signals. Each counting circuit is designed to generate one output pulse for every N input pulse where N is determined by the desired timing frequency.

The counters most frequently used in timing applications are clocked counters and ripple-through counters. Clocked counters generally count in a continuous binary sequence, offering the advantage of having their output be a binary representation of the number of pulses counted. The input of each stage of a clocked counter includes the clock pulse and the outputs from all preceding stages. Although this arrangement results in only a single-stage delay in transferring from any state to the next state, it also requires increased circuit complexity in each succeeding stage. Further, it raises clock distribution problems at very high frequencies because each counter stage presents a load to the clock.

Ripple-through counters have only a single input per stage: the output of the previous stage. The clock signal is only applied to the first stage of a ripple-through counter resulting in only a single-stage load on the clock. However, this type of counter suffers from the disadvantage that the settling time between inputs varies from a single-stage delay to an N stage delay, depending upon the number of stages a particular input has to ripple through. This disadvantage has heretofore eliminated ripple-through counters from use in high-speed synchronous circuit design. Clocked counters, despite their increased complexity were used so that minimum delay in the propagation of output pulses will be achieved.

It is an object of this invention to provide a machine-implemented process suitable for use in constructing high-speed counters which combine the best features of both clocked counters and ripple-through counters.

It is a specific object of this invention to provide a machine-implemented process for designing ripple-through counters having minimum output propagation delay times.

SUMMARY OF THE INVENTION

In accordance with these objects, the invention uses desired values of loop length, clock frequency, and single-stage delay time to design a ripple-through counter having an output propagation delay time equal to the single-stage delay time.

The process chooses the counter's terminal state in accordance with the clock frequency and single-stage delay time such that the counter settles completely to its terminal state in a minimum time after the input of the last pulse to be counted in a particular cycle. The counter's initial state is determined by adding the loop length to the chosen terminal state. These two states are then adjusted so as to minimize the logic circuitry required to reset the counter at the end of each counting cycle.

DETAILED DESCRIPTION

Figure 1:
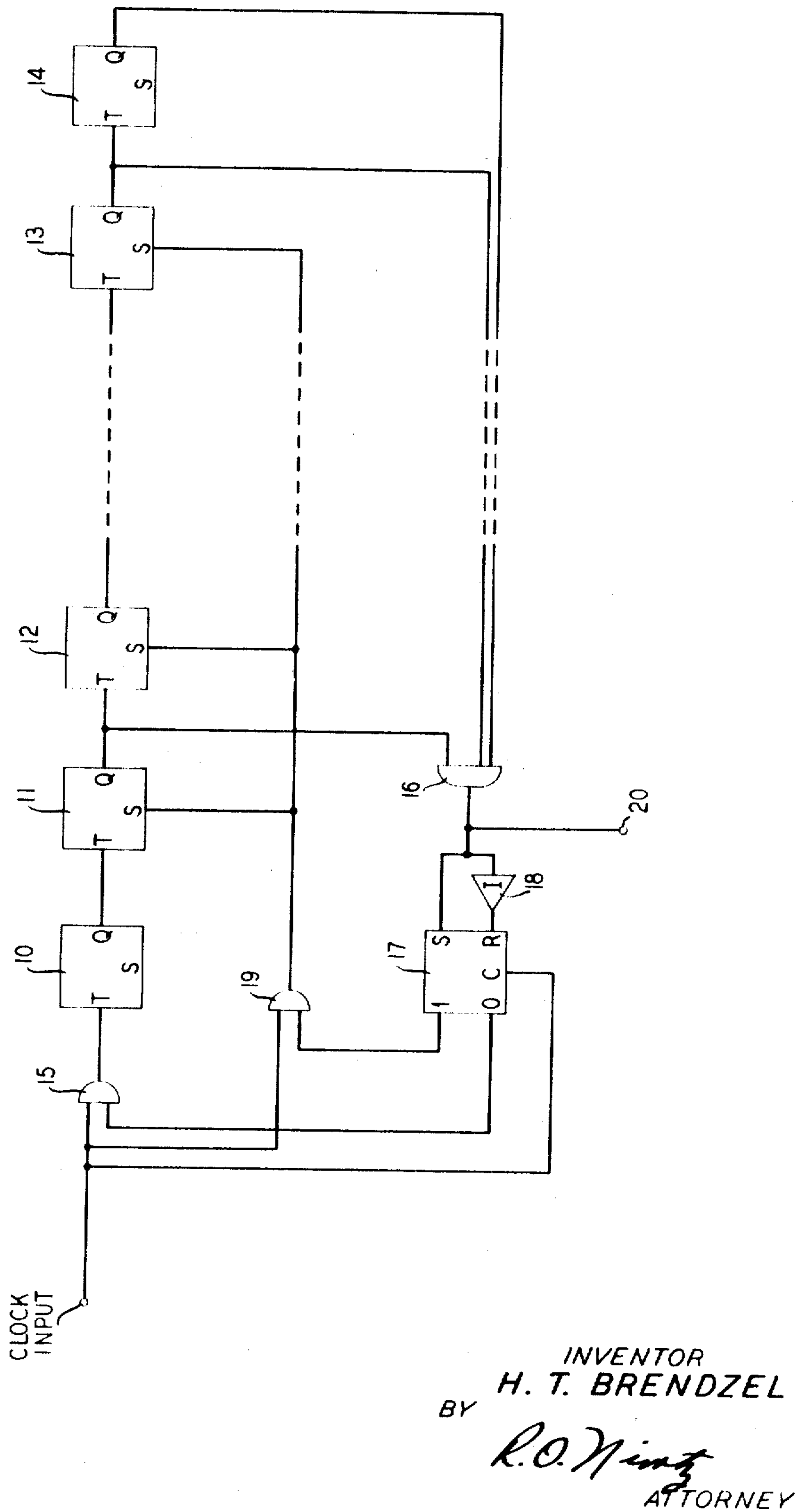
FIG. 1 is a generalized representation of the type of counter that is designed by this invention.

The invention may best be understood by a consideration of the operation of the type of ripple-through counter that may be designed by using the invention.

The counter changes state each time an input pulse is applied. A counting cycle comprises beginning at an initial state, counting a predetermined number of inputs, sensing the terminal state, and setting particular bits so as to return to the initial state. In order to achieve the objects hereinbefore stated, the terminal state must be such that the counters' output occurs in a minimum time after the last pulse to be counted, and the initial and terminal states must be chosen so that the transition from the terminal state to the initial state may be achieved quickly and simply.

In order to obtain the desired minimum output propagation delay time, the terminal state must have the shortest propagation delay possible. The shortest propagation delay (SPD) that it is possible for a counter to have is the delay of a single-stage plus the propagation delay of its associated sensing gate. A ripple-through counter has many SPD states because all states that represent a binary odd number are SPD states when the frequency of operation is relatively low. Binary odd numbers are SPD states because changing from any even number to the next number requires only a single stage to change. For example, 00011 in a five-stage counter is an SPD state because the change from 00010 to 00011 requires only the first stage to change state.

At very high frequencies some odd states are not SPD states. For example, 0000000001 in a 10-stage counter may not be an SPD state at 50 MHz because, while the least significant flip-flop may have changed and settled down after the last clock pulse, other flip-flops could still be changing as a result of the next to last clock pulse. Specifically, if the propagation delay per stage is 5 nanoseconds and if the counter is at state 1111111111 and then 2 clock pulses appear, 5 nanoseconds after the second pulse has occurred the state of the counter is 1111100001 and still changing toward 0000000001. This indicates that at high speeds a better choice for a terminal state would be a state having an additional "1" positioned so as to terminate the ripple, as for example, 0000010001.

The precise choice of a terminal state is dependent not only upon the requirement of shortest output propagation delay but also upon the requirement that the amount of logic circuitry used to preset the counter to the initial state from the terminal state be minimized. The relationship between the initial and terminal states of the counter is determined by the loop length, that is, the number of inputs that must be counted per counting cycle.

When the loop length, L, is known, the number of states, S, required to implement the counter can be found by choosing the smallest value of S such that $L \leq 2^S$. (1) The number of unused counter states, U, is then $U = 2^S - L$. (2)

In order to return to the initial state following a counting cycle the counter must "jump" over these unused states. Due to the synchronous nature of the counter the time required to preset the counter must be considered. To insure that the counter will be preset properly, the first clock pulse period in each new counting cycle is used to perform the presetting. This requires the presetting operation to jump over what would normally be the counter's initial state. The jump size, $J$, is therefore one more than the number of unused states: $J = 2^S - L + 1$. (3)

The jump size algebraically added to the terminal state value is the initial state. In implementing the counter, logic circuitry must be provided that resets particular bits in the terminal state so as to effectively perform this addition and return to the initial state. The invention, as will now be described, utilizes the bit pattern of the binary representation of *J* to determine which bits must be reset.

If the terminal state were chosen to be zero, the "1's" in the binary representation of *J* would indicate the locations in the terminal state that have to be set from "0" to "1" in order to reach the initial state. However, as previously indicated, the terminal state can not be zero but rather must have at least a "1" in the least significant bit and possibly additional "1's" in more significant bit positions to insure that the terminal state has the SPD quality. These "1's" pose a problem if *J* has a "1" in the same position since it means that the bit in that position has to be reset to a "0", thus generating a ripple. The correct state of the next most significant position will then be dependent upon its value prior to the presetting operation and upon the fact that a ripple was generated. The problem associated with the extra "1" in the terminal state can be eliminated by positioning the "1" in the terminal state so that it does not coincide with a "1" in the same bit position of *J*. The problem posed by the "1" in the least significant bit position of the terminal state can be circumvented in one of two ways, depending upon whether, in a particular case, *J* is even or odd.

If *J* is even the initial state will be odd since the terminal state is odd. Therefore, the least significant bit of the terminal state need not be changed in those counters for which *J* is even. Furthermore, it must remain a "1" during the preset cycle and so the normal clock input pulse must be inhibited. Presetting is completed by setting to a "1" those counter stages indicated by the remaining "1's" in the binary representation of *J*.

When *J* is odd, the initial state will be even and hence the least significant bit of the terminal state must be reset to a "0". This may be easily accomplished by not inhibiting the clock input pulse that occurs during the preset cycle. This, however, causes a ripple to be propagated into the second stage of the terminal state. If the second least significant bit of *J* is a "0", indicating that the second stage of the terminal state need not be reset, the ripple will terminate at the second stage and the remaining bits of *J* will indicate those remaining bits of the terminal state that must be preset.

If *J* contains a string of "1's" starting with the second least significant bit, it is obvious that algebraically adding *J* to the terminal state would cause a ripple to propagate through the string of "1's" resulting in the initial state having "0's" in the corresponding bit position. Thus the "1's" in *J* no longer represent the bits to be set. This difficulty can be obviated by insuring that the ripple stops in the second stage. This can be done by changing the terminal state through the addition of a "1" in the second least significant bit. To preserve the proper loop length, the initial state must also be changed. This is accomplished by using *J*+3 in place of *J* to indicate those terminal state bits that must be reset. The "+3" is necessary because, as previously mentioned, the bits of *J* accurately indicate which terminal state bits must be reset only in case the terminal state is all zeros. Since the terminal state now has "1' s" in the two least significant bit positions, +3 must be added to *J* so that when *J* is effectively added to the terminal state by the logic circuitry the correct initial state will result.

These modifications to the terminal state and to *J* in the case where *J* contains a string of "1's" starting with the second least significant bit have the following result: the clock pulse is not inhibited during the preset cycle and the "1's" in the binary representation of *J*+3 indicate the bits of the terminal state that must be preset.

Once the terminal state and initial state have been determined, the logic circuitry required to actually perform the presetting can be specified. In all counter implementations this logic circuitry comprises a two input AND gate, a multiple input AND gate, and a flip-flop. In those counters requiring the clock pulse to be inhibited during the preset cycle an additional AND gate is required. The general form of the counter designed by the present invention is hence as shown in FIG. 1.

113 The counter is formed of as many interconnected stages as is required by the loop length. Each stage 10–14 is a single-input toggle flip-flop of the type well-known in the prior art. AND-gate 15 is only present in those counters in which the clock pulse must be inhibited during the preset cycle. AND-gate 16 is the sensing gate, that is, it provides an output signal when it senses that the terminal state has been reached. This output signal drives flip-flop 17 and also provides the counter's output signal at terminal 20. Flip-flop 17 is a clocked set-reset flip-flop of the kind well-known to the prior art. It is set by the presence of both the clock plus an output signal from gate 16 and is reset by inverter 18 by the absence of an output signal from gate 16. Flip-flop 17 insures that the output signal from gate 16 is of sufficient duration to allow the presetting to occur.

AND-gate 19 is the setting gate. It generates an output signal upon the first occurrence of the clock signal after the terminal state has been detected by sense gate 16. The output signal of gate 19 is used to reset the appropriate counter stages.

The resetting function performed by AND-gate 19 is straightforward and is completely defined by the bit positions of the "1's" in *J*, as has been described. The sensing function performed by AND-gate 16 is more complex. The detection of a particular state in an N state counter normally requires an N input AND gate. The size of the gate may be reduced, however, when the direction of counting is known.

For example, consider the problem of detecting the state 1010 if it is known that counting always begins at 0000. A four-stage binary counter can be thought of as a counting in each of the four sectors 00XX, 01XX, 10XX, 11XX as defined by the two most significant bits. The detection of sector 10XX requires only a one input gate if counting begins at 0000. Further, XX10 occurs only once per sector, and, once the sector has been determined, requires only a one input gate. Hence the detection of 1010 requires only a two input gate.

The terminal state of a counter designed by the invention has most of its significant bits equal to one rather than zero, that is, the terminal state is in the last sector. This allows the sensing circuitry to sense "1's" rather than "0's" and helps alleviate the aforementioned problem of the propagating ripple. It should be observed that since the terminal state is not zero, the initial state, formed by effectively adding *J* to the terminal state, will be greater than a number consisting of all "1's" at the positions greater than and equal to that of the most significant bit of *J*. For example, for terminal state 1100101 and *J* equal to 10010, their sum will be 1110111 which is greater than 1110000. Therefore, the sensing AND gate of counters designed by the invention must have as inputs all of the significant bits of the counter up to and including the bit position corresponding to the most significant bit of *J*.

The theory of operation of the machine process comprising this invention is more specifically described by the digital computer program listing shown on pages A1 and A2 of the Appendix. This program listing, written in FORTRAN IV, is a description of the set of electrical control signals that serve to reconfigure a suitable general purpose digital computer into a novel machine capable of performing the invention. The steps performed by the novel machine on these electrical control signals in the general purpose digital computer comprise the best mode contemplated to carry out the invention.

A general purpose digital computer suitable for being transformed into the novel machine needed to perform the machine-implemented process of this invention is an IBM System 360 Model 65 computer equipped with the OS/360 FORTRAN IV compiler as described in the IBM manual, *IBM System* 1360 *FORTRAN* IV *Language - Form* 628–6515. Another example is the GE–635 computer equipped with the GECOS FORTRAN IV compiler as described in the *GE* 625/635 *FORTRAN* IV *Reference Manual, CPB*–1006*E*.

Figure 2A:
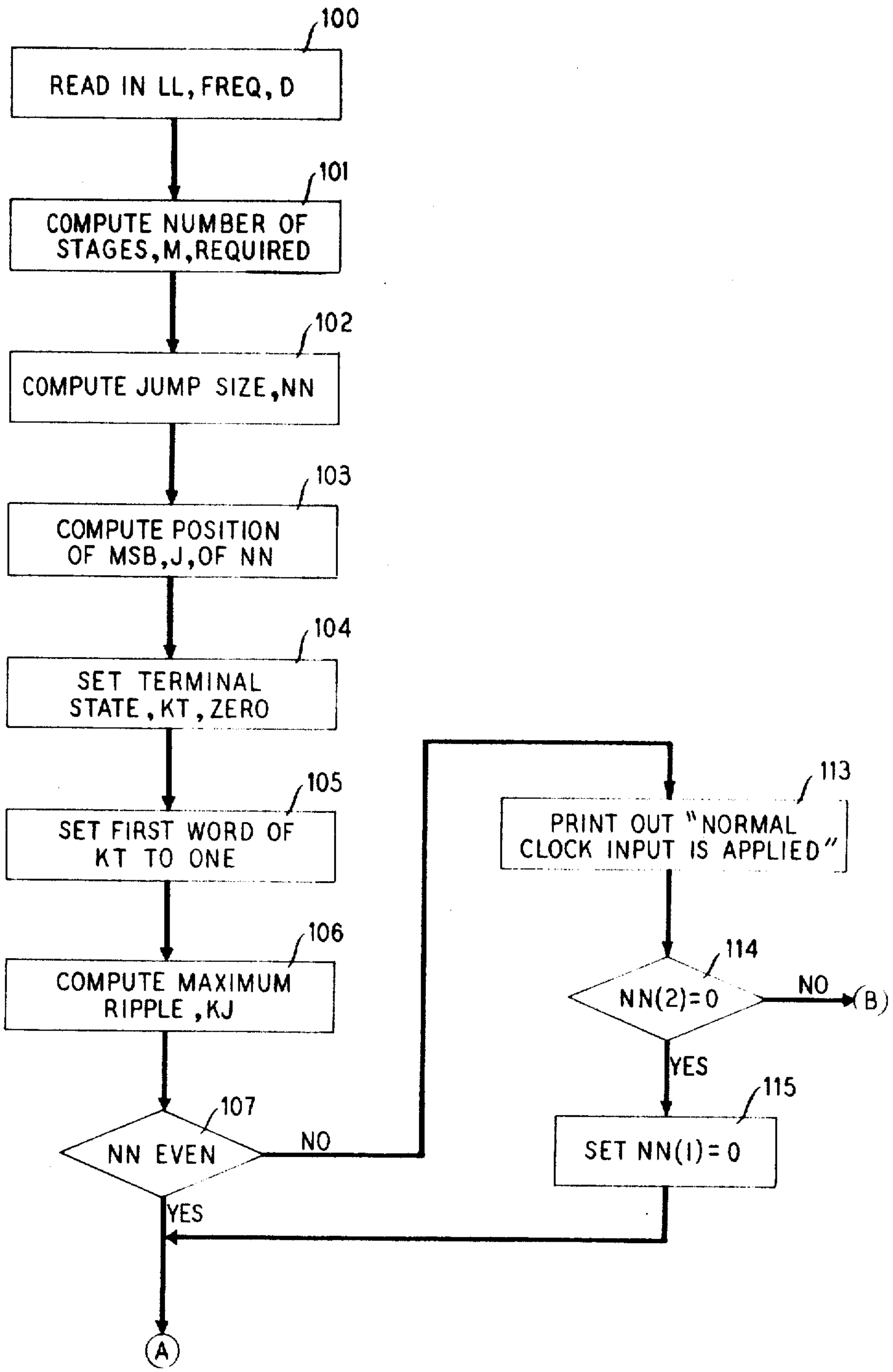
FIGS. 2A and 2B are flow charts of the machine process of this invention.
Figure 2B:
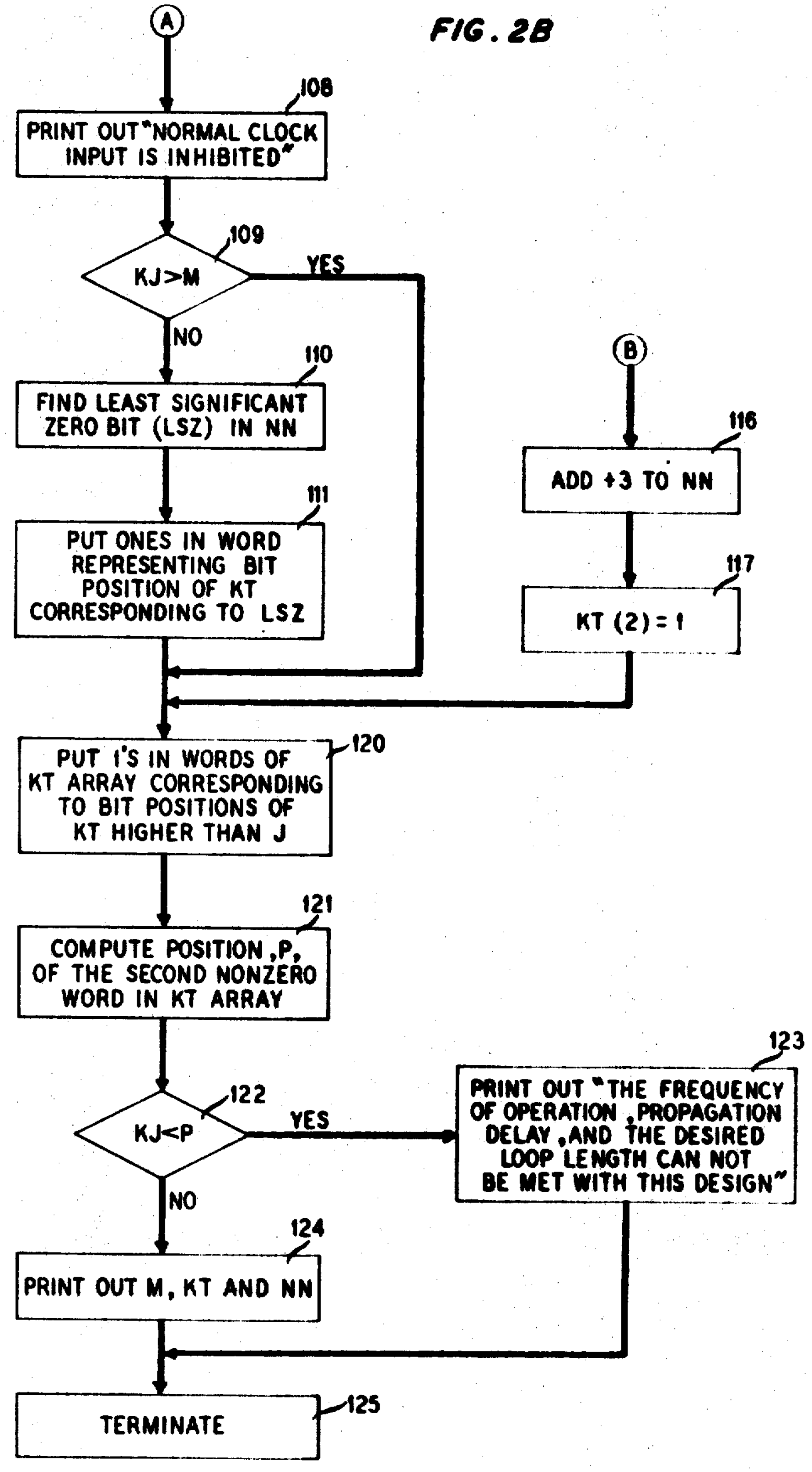

The program listing, which has been extensively commented, is more readily understood with the aid of the flow charts of FIGS. 2A and 2B.

FIGS. 2A and 2B can be seen to include three different symbols. The rectangles, termed "operation blocks," contain the description of a particular detailed computational step of the process. The diamond-shaped symbols, termed "conditional branch points," contain a description of a test performed by the computer to enable it to choose the next step to be performed. The circles are used merely as a drawing aid to provide continuity between figures and to prevent overlapping lines.

Block 100 of FIG. 2A shows the input of the three variables required by the process; the loop length LL, the clock frequency FREQ, and the single stage delay D. The first computation performed by the process, block 101, is that of the number of stages, M, required to form the counter. As shown in the listing, $M = 1.443 \log_e (LL) + 1$ . (4)

Next, block 102, the jump size, shown in equation (3) as "*J*" and represented by "*NN*" in the program, is computed. The most significant bit of *NN*, labeled *J*, is found, block 103, for later use. Blocks 104 and 105 set the first word of array KT to one. The array KT represents the terminal state.

In accordance with the previous discussion, block 106 computes the maximum number of stages that a pulse could ripple through in one clock pulse period plus one stage delay. The jump size, *NN*, is then checked in conditional branch point 107 to determine if it is even or odd. If *NN* is even, block 108, shown in FIG. 2B, causes "NORMAL CLOCK INPUT IS INHIBITED" to be printed out, indicating that AND gate 15 of FIG. 1 must be used to implement the desired counter. The maximum number of stages that a pulse could ripple through in one clock pulse period plus one stage delay is then compared to the number of counter stages, conditional branch point 109. If this is greater than the number of counter stages, a "1" must be inserted in the terminal state to stop the ripple (blocks 110 and 111). The extra "1" is put in the bit position of the terminal state corresponding to the least significant zero bit of *NN* so as to insure that it does not coincide with a "1" in *NN*, as previously discussed. Block 120 then fills in the remainder of the terminal state with "1's" to put the operation of the counter in the last sector of the counting cycle. Blocks 121 to 123 test the counter design to determine whether the maximum ripple is too small to allow the counter to operate. "THE FREQUENCY OF OPERATION, PROPAGATION DELAY, AND THE DESIRED LOOP LENGTH CAN NOT BE MET WITH THIS COUNTER DESIGN" is printed out if this is the case. Block 124 prints out the computed values of M, KT, and *NN* which are used to construct the counter in accordance with the description of FIG. 1 and the process terminates at block 125.

Returning now to conditional branch point 106, if *NN* is odd, block 113 causes "NORMAL CLOCK INPUT IS APPLIED" to be printed out, indicating that AND gate 15 of FIG. 1 need not be used to implement the desired counter. The second bit of *NN* is then checked in conditional branch point 114. If it is a "0", then the first bit of *NN* is set to a "0" in block 115. This is done because in this program *NN* serves two purposes. It allows the program to compute the terminal state and is modified by the program to indicate, when printed out, those counter stages which must be preset to return to the initial state. That is, the "1's" in *NN* when it is printed out define the outputs of AND gate 19 of FIG. 1. Control is transferred from block 115 to block 108 and computation continues as described above.

If the second bit of *NN* is not a "0" then block 116 adds three to *NN*, block 117 sets the second bit of the terminal state to one and computation continues at block 120 as previously described. The operations of blocks 116 and 117 provide for the termination of the ripple caused by the clock input caused when the clock input is not inhibited.

APPENDIX

```
1ϕ Dimension KT(2ϕ), N(2ϕ), IQ(2ϕ)
15 Print, "This program generates a terminal state for a counter"
2ϕ Print, "To be sensed for a desired loop length."
25 Print ↑ "Type the desired loop length, freq. of operation"
3ϕ Print, "And propogation delay per state."
35 Print, "Freq. in mHz., delay in nsec., free format."
4ϕC
45C    LL=LOOP LENGTH, FREQ.=FREQUENCY, D=FF
   DELAY
5ϕC
55 Input, LL, FREQ. D
6ϕC
65C    M=Number of stages
7ϕC
75 2ϕϕ M=1.443*Log(LL)+1
8ϕC
85C    NN=Number of states required to skip
9ϕC
95 NN=(2**M)-LL+1
1ϕϕ AX=NN
1ϕ5 PRINT,↑ ↑ ↑
11ϕC
115C    J=Position of MSB in binary rep. of NN
12ϕC
125 J=1.443*LOG(NN)+1
13ϕ KT(1)=1
135C
14ϕC    Initialize KT array—Terminal state
145C    Compute the full binary rep. of NN
15ϕC
155 DO 1 KQ=1, 2ϕ
16ϕ KT(KQ)=ϕ
165 IA=NN/2
17ϕ N(KQ)=NN-2*IA
175 I NN=IA
18ϕ IX=ϕ
185 KT(1)=1
19ϕ MA=2
195C
2ϕϕC    KJ=Max. number of stages rippled in 1 clock
2ϕ5C
21ϕ KJ=1+(1ϕϕϕ./(Freq*D))
215C
22ϕC    Check if NN is odd
225C
23ϕ IF (N(1)) 2,2,3
235 2 Print, ↑ "Normal clock input is inhibited during set cycle"
24ϕ 3ϕ IF(KJ-J+1) 4,5,5
245C
25ϕC    KT array is computed (DO loop 6)
255C
26ϕ 4 IX=1
265 5 DO 6 I=MA, M
27ϕ IF (I-J) 7,7,8
275 7 IF(N(I)) 9,9,11
28ϕ 9 IF(IX) 11,11,12
285 11KT(I)=ϕ
29ϕ GO TO 6
295 12 IX=ϕ
3ϕϕ 8 KT(I)=1
3ϕ5 6 Continue
31ϕ GO TO 1ϕ
315 3 print, ↑ "Normal clock input is applied during set cycle"
32ϕ if (N(2)) 2ϕ, 2ϕ, 13
325 2ϕ KT(2)=ϕ
33ϕC
335C    If N(2)=1 Then 3 is added to jump state
34ϕC    If N(2)=1 Then 3 is added to jump state
345C
35ϕ N(1)=ϕ
355 MA=3
36ϕ Go to 3ϕ
365 13 KT(2)=1
37ϕ NN=AX+3
375 J=1.443*Log (NN)+1
38ϕ DO 34 KQ=1, 2ϕ
385 IA=NN/2
39ϕ N(KQ)=NN-2*IA
395 34 NN=IA
4ϕϕ J1=J+1
4ϕ5 DO 14 JA=J1, M
41ϕ 14 KT(JA)=1
415 1ϕ DO 75 I=2, 2ϕ
42ϕ IF(KT(I)) 75, 75, 77
425 77 IQS=I-1
43ϕ Go To 76
435 75 Continue
44ϕ 76 IF(KJ-IQS) 78, 78, 79
445 78 Print ↑ ↑ ↑ "The frequency of operation, propogation delay."
45ϕ Print, "And the desired loop length cannot be met"
455 Print, "With this counter design."
46ϕ Go To 211
465 79 Print 15, LL
47ϕ Print 16, M
475 15 Format ("For a desired loop length of," 16, ",")
48ϕ 16 Format ("A," I3, "Stage counter is required")
485 DO 113 MX=1, 2ϕ
49ϕ 113 IQ(MX)=/4ϕϕϕϕϕ
495 INT=1
5ϕϕ DO 117 MY=1, M
5ϕ5 IF(KT(M+1-MY)) 115, 115, 116
51ϕ 116 IQ(MY)=/63ϕϕϕϕ
515 Go To 117
52ϕ 115 IF(INT) 117, 117, 118
525 118 INT=ϕ
53ϕ IQ(MY)=/26ϕϕϕϕ
535 117 Continue
54ϕ Print 17, (KT(M+1-JX), JX=1, M)
545 17 Format ("The terminal state to be sensed is," 2ϕI 1)
55ϕ Print 19, (IQ(JX), JX=1, M)
555 19 Format ("Inputs to the sense 'and' gate are," 2ϕA1)
56ϕ Print 18, (N(M+1-JX), JX=1, M)
565 18 Format ("The 1's Indicate the bits to be set," 2ϕI 1)
57ϕ 211 Print ↑ ↑ ↑" If another loop length is desired, Type new"
575 Print, "Inputs; otherwise type ϕ"
58ϕ Input, JKL
585 If (JKL)21ϕ, 21ϕ, 2ϕϕ
59ϕ End
```

What is claimed is:

1. The machine-implemented process of designing a clock-pulse-driven ripple-through binary counter in accordance with desired values of loop length, clock frequency, and single-stage delay time comprising the steps of:

1. determining from said loop length the number of stages required to implement said counter;
2. computing a terminal state having a minimum output propagation delay time;
3. computing from said single-stage delay time and said clock frequency the maximum number of stages a pulse would ripple through in one clock period plus one stage delay;
4. comparing said maximum number of stages to said number of stages required to implement said counter;
5. modifying said terminal state if said maximum number of stages is greater than said number of stages required to implement said counter; and
6. determining the bits in said terminal state that must be reset at the end of each counting cycle.

2. The machine-implemented process of designing a clock-pulse-driven ripple-through binary counter in accordance with desired values of loop length, clock frequency, and single-stage delay time comprising the steps of:

1. determining from said loop length the number of stages required to implement said counter;
2. computing the binary representation of the number of unused stages of said counter;
3. determining whether said binary representation of the number of unused stages is even or odd;
4. indicating that said clock pulse must be inhibited when said counter is reset if said binary representation of the number of unused stages is even;
6. computing from said single-stage delay time and said clock frequency the maximum number of stages a pulse could ripple through in one clock period plus one stage delay;
6. comparing said maximum number of stages to said number of stages required to implement said counter;
7. modifying said binary representation of said terminal state if said maximum number of stages is greater than the binary representation of said number of stages required to implement said counter;
8. computing the value of the position of the second nonzero digit in said binary representation of said terminal state;
9. comparing said maximum number of stages to said computed value;
10. indicating that the design of a ripple-through counter having said desired values is not possible if the maximum number of stages is less than said computed position; and
11. printing out the terminal state and an indication of the bits that must be reset to return to the initial state if said maximum number of stages is greater than said computed value.

3. The machine-implemented process of designing a clock-pulse-driven ripple-through binary counter in accordance with desired values of loop length, clock frequency, and single-stage delay time comprising the steps of:

1. determining from said loop length the number of stages required to implement said counter;
2. computing the binary representation of the number of unused stages of said counter;
3. determining whether said binary representation of the number of unused stages is even or odd;
4. indicating that said clock pulse must be applied when said counter is reset if said binary representation of the number of unused stages is odd;
5. determining whether the second least significant bit of said binary representation of the number of unused stages is a zero;
6. setting the least significant bit of said binary representation of the number of unused stages to a one if said second least significant bit is a zero;
7. computing from said single stage delay time and said clock frequency the maximum number of stages a pulse could ripple through in one clock period plus one stage delay;
8. comparing said maximum number of stages to said number of stages required to implement said counter;
9. computing the value of the position of the second nonzero digit in said binary representation of said terminal state;
10. comparing said maximum number of stages to said computed value;
11. indicating that the design of a ripple-through counter having said desired values is not possible if the maximum number of stages is less than said computed position; and
12. printing out the terminal state and an indication of the bits that must be reset to return to the initial state if said maximum number of stages is greater than said computed value.

4. The machine-implemented process of designing a clock-pulse-driven ripple-through binary counter in accordance with desired values of loop length, clock frequency, and single-stage delay time comprising the steps of:

1. determining from said loop length the number of stages required to implement said counter;
2. computing the binary representation of the number of unused stages of said counter;
3. determining whether said binary representation of the number of unused stages is even or odd;
4. indicating that said clock pulse must be applied when said counter is reset if said binary representation of the number of unused stages is odd;
5. determining whether the second least significant bit of said binary representation of the number of unused stages is a zero;
6. adding the binary number 11to said binary representation of said number of unused stages if said second least significant bit of said binary representation of the number of unused states is a one;
7. setting the second least significant bit of said binary representation of said terminal state to a one if said second least significant bit of said binary representation of the number of unused states is a one;
9. computing the position of the second nonzero digit in said binary representation of said terminal state;
9. comparing said maximum number of stages to said computed position;
10. indicating that the design of a ripple-through counter having said desired values is not possible if the maximum number of stages is less than said computed position; and
11. printing out the terminal state and an indication of the bits that must be reset to return to the initial state if said maximum number of stages is greater than said computed value.